United States Patent
Van Veen et al.

(10) Patent No.: US 11,728,123 B2
(45) Date of Patent: Aug. 15, 2023

(54) CHARGED PARTICLE BLOCKING ELEMENT, EXPOSURE APPARATUS COMPRISING SUCH AN ELEMENT, AND METHOD FOR USING SUCH AN EXPOSURE APPARATUS

(71) Applicants: Alexander Hendrik Vincent Van Veen, Delft (NL); Derk Ferdinand Walvoort, Delft (NL)

(72) Inventors: Alexander Hendrik Vincent Van Veen, Delft (NL); Derk Ferdinand Walvoort, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/409,726

(22) Filed: Aug. 23, 2021

(65) Prior Publication Data
US 2021/0384002 A1 Dec. 9, 2021

Related U.S. Application Data

(63) Continuation of application No. 16/638,124, filed as application No. PCT/JP2018/024475 on Jun. 21, 2018, now Pat. No. 11,101,099.
(Continued)

(51) Int. Cl.
*H01J 37/04* (2006.01)
*H01J 37/317* (2006.01)

(52) U.S. Cl.
CPC ........ *H01J 37/045* (2013.01); *H01J 37/3177* (2013.01); *H01J 2237/002* (2013.01); *H01J 2237/0437* (2013.01)

(58) Field of Classification Search
CPC .... H01J 37/026; H01J 37/045; H01J 37/3177; H01J 2237/002; H01J 2237/043; H01J 2237/0436; H01J 2237/0437
See application file for complete search history.

(56) References Cited

U.S. PATENT DOCUMENTS

| 4,448,865 A * | 5/1984 | Bohlen ..................... G03F 1/20 |
| | | 216/2 |
| 5,214,289 A | 5/1993 | Betsui |

(Continued)

FOREIGN PATENT DOCUMENTS

| CN | 102956420 A | 3/2013 |
| CN | 103858211 A | 6/2014 |

(Continued)

OTHER PUBLICATIONS

PCT Notification of Transmittal of the International Search Report of the International Searching Authority dated Sep. 25, 2018, in the corresponding PCT International Application No. PCT/JP2018/024475 (2 pgs.).

(Continued)

*Primary Examiner* — David E Smith
(74) *Attorney, Agent, or Firm* — Finnegan, Henderson, Farabow, Garrett & Dunner, LLP

(57) ABSTRACT

The invention relates to an exposure apparatus and a method for projecting a charged particle beam onto a target. The exposure apparatus comprises a charged particle optical arrangement comprising a charged particle source for generating a charged particle beam and a charged particle blocking element and/or a current limiting element for blocking at least a part of a charged particle beam from a charged particle source. The charged particle blocking element and the current limiting element comprise a substantially flat substrate provided with an absorbing layer comprising Boron, Carbon or Beryllium. The substrate further (Continued)

preferably comprises one or more apertures for transmitting charged particles. The absorbing layer is arranged spaced apart from the at least one aperture.

20 Claims, 7 Drawing Sheets

Related U.S. Application Data

(60) Provisional application No. 62/542,310, filed on Aug. 8, 2017.

(56) References Cited

U.S. PATENT DOCUMENTS

| | | | | |
|---|---|---|---|---|
| 5,215,623 | A * | 6/1993 | Takahashi | B82Y 40/00 250/396 R |
| 6,014,200 | A * | 1/2000 | Sogard | B82Y 40/00 355/53 |
| 6,319,636 | B1 * | 11/2001 | Ham | G03F 1/20 430/296 |
| 8,558,196 | B2 | 10/2013 | Wieland et al. | |
| 10,211,023 | B2 * | 2/2019 | Matsumoto | H01J 37/3177 |
| 11,101,099 | B2 * | 8/2021 | Van Veen | H01J 37/09 |
| 2012/0292524 | A1 | 11/2012 | Wieland et al. | |
| 2012/0293780 | A1 | 11/2012 | Dinu-Gurtler et al. | |
| 2013/0149646 | A1 | 6/2013 | Touya et al. | |
| 2013/0299697 | A1 | 11/2013 | Enyama et al. | |
| 2014/0197336 | A1 | 7/2014 | Watanabe et al. | |
| 2014/0231668 | A1 * | 8/2014 | Yasuda | H01J 37/3026 250/396 R |
| 2016/0099129 | A1 * | 4/2016 | Yamashita | H01J 37/3177 250/396 R |
| 2017/0345612 | A1 * | 11/2017 | Touya | H01J 37/045 |

FOREIGN PATENT DOCUMENTS

| | | |
|---|---|---|
| JP | 51-110963 | 9/1976 |
| JP | S57-130357 A | 8/1982 |
| JP | H11-317357 A | 11/1999 |
| JP | 2000-195790 A | 7/2000 |
| JP | 2001-068404 | 3/2001 |
| JP | 2001-267207 | 9/2001 |
| JP | 2004-259478 | 9/2004 |
| JP | 2005-303165 | 10/2005 |
| JP | 2009-215609 | 9/2009 |
| JP | 2013544030 A | 12/2013 |
| JP | 2014-143393 | 8/2014 |
| JP | 2014-154233 | 8/2014 |
| JP | 2016522572 A | 7/2016 |
| KR | 1020050001840 | 1/2005 |
| TW | 563256 | 11/2003 |

OTHER PUBLICATIONS

Notice of Reasons of Rejection issued in related Japanese Patent Application No. 2020-506278; dated Nov. 30, 2020 (6 pgs.).
The partial supplementary European search report issued in related Application No. 18843031.8, dated May 3, 2021 (2 pgs.).
Agar, Alan W. et al., "4.1 The Story of European Commercial Electron Microscopes", Advances in Imaging and Electron Physics, vol. 96, Stanstead, United Kingdom, Jan. 1, 1996 (170 pgs.).
Supplementary European Search Repot issued in related European Application No. EP 18 84 3031; dated Sep. 7, 2021 (5 pgs.).
Office Action of the Intellectual Property Office of Taiwan issued in related Taiwanese Patent Application No. 107125903; dated Apr. 29, 2022 (11 pgs.).
Notice of Reasons for Rejection from the Japan Patent Office issued in related Japanese Patent Application No. 2021-135898; dated Aug. 1, 2022 (6 pgs.).
First Office Action from the Patent Office of the People's Republic of China issued in related Chinese Patent Application No. 201880061802X; dated Feb. 28, 2023 (20 pgs.).

* cited by examiner

CHARGED PARTICLE BLOCKING ELEMENT, EXPOSURE APPARATUS COMPRISING SUCH AN ELEMENT, AND METHOD FOR USING SUCH AN EXPOSURE APPARATUS

CLAIM FOR PRIORITY

This application is a continuation of application Ser. No. 16/638,124, filed Feb. 10, 2020, which is a national stage filing under 35 U.S.C. § 371 of International Application No. PCT/JP2018/024475, filed on Jun. 21, 2018, and published as WO 2019/031093 A1, which claims priority of U.S. Provisional Application No. 62/542,310, which was filed on Aug. 8, 2017, which are incorporated herein by reference in their entireties.

TECHNICAL FIELD

The invention relates to a charged particle blocking element for use in a charged particle optical arrangement for projecting a charged particle beam onto a target. The invention further relates to an exposure apparatus for projecting a charged particle beam onto a target, which exposure apparatus comprises a charged particle blocking element, and relates to a method for projecting a charged particle beam onto a target using such an exposure apparatus. In addition, the invention relates to a method of manufacturing a semiconductor device and/or a method for inspecting a target by means of such an exposure apparatus.

BACKGROUND

In the semiconductor industry, an ever increasing desire exists to manufacture smaller structures with high accuracy and reliability. In a charged particle beam exposure apparatus, a target surface can be exposed to one or more charged particle beams directed to and focused on the target surface with high accuracy. In addition, the use of charged particles allows to obtain a much higher resolution and precision for transferring or analyzing a pattern on the target surface, when compared with an exposure apparatus which uses light for exposing the target surface.

However, to be commercially viable, the charged particle exposure apparatuses need to be able to meet challenging demands for substantial wafer throughput and stringent error margins, both for lithography systems and for inspection systems. A higher throughput may be obtained by using more charged particle beams in the exposure apparatus, and hence by using more current.

However, an increase in the current results in more charged particles that interact with components in the exposure apparatus. Collisions between charged particles and system components inside the exposure apparatus may cause significant heating of respective components.

Problems related to heating of components within charged particle beam systems are generally addressed by actively cooling such components, as described in for example the granted U.S. Pat. Nos. 8,558,196 and 9,165,693 as well as in the International Patent Application published as WO2013/171216.

In an article by M. van Zaalen in "VAN TEKENTAFEL NAAR OVEN", Link Magazine, XVIII:1 (February 2016), page 28 and 29, the problem of heating of the collimator lens in a maskless multi-electron-beam lithography system is identified, caused by the high electric field within the collimator and the high current of the electron beam being focused by the collimator. As also indicated in the article of M. van Zaalen, not all the electrons of said charged particle beam(s) pass through the collimator, but some are reflected within the collimator. This phenomenon also contributes to the heating of the collimator. The heating of beam manipulation components may lead to thermal deformations that reduce the accuracy of the exposure process. As described in the article of M. van Zaalen, this was solved by a re-design of the suspension of the collimator within the lithography apparatus. The cooling of the collimator was therein improved by enabling heat to be removed from the collimator by thermal conduction via the modified suspension.

SUMMARY OF THE INVENTION

It is an object of the present invention to provide a charged particle exposure apparatus, as well as a component therefor, which at least partially reduces heating of the components within the exposure apparatus. Charged particles should be understood as encompassing both electrons and ions. When reference is made to a charged particle beam, this could be made up of either electrons or ions. The present invention is in particular related to electron beam exposure apparatuses, including electron (multi-)beam lithography systems, various types of electron microscope, and inspection systems. The invention can however also be applied in systems using other types of charged particles, including positively or negatively charged ions, for example Helium ions.

According to a first aspect, the invention provides a charged particle blocking element for blocking charged particles, wherein the charged particle blocking element comprises a substrate, wherein the substrate comprising at least one aperture allowing passage of charged particles, wherein at least a portion of a surface of the substrate is provided with an absorbing layer of a material comprising Boron, Carbon or Beryllium, wherein the absorbing layer is arranged spaced apart from the at least one aperture, and wherein at least part of the surface of the substrate which is provided with the absorbing layer comprises an electrically conductive material.

The absorbing layer at least partially absorbs the charged particles impinging thereon. That is, the layer is functional for receiving the charged particles impinging thereon, the charge of which is passed on to the conductive material in order to be transported away from the charged particle blocking element. The conductive material may be realized by providing the substrate located underneath the absorbing layer with an electrically conductive layer, or by providing the substrate as at least partially electrically conductive, e.g. wherein at least part of the surface provided with the absorbing layer is electrically conductive.

The charged particle blocking element is suitable for blocking charged particles in a variety of applications. It can be used for at least partially blocking a beam of charged particles along its trajectory within a charged particle exposure apparatus and/or inspection apparatus. This may be for shaping a beam or a plurality thereof such as in a current limiting aperture array element. For example it can be used in one or more of the aperture arrays in a system as described in U.S. Pat. No. 8,653,485 B2, in particular in an aperture array 4A of a system as illustrated in FIG. 12 of U.S. Pat. No. 8,653,485 B2. It can also be used as a shutter element for temporarily switching off a beam or a beam source by entirely blocking the same without a need of switching off the source itself. This may especially be advantageous where switching on the source normally comes with noticeable settling time. In a system as illustrated in FIG. 12 of U.S.

Pat. No. 8,653,485 B2, it could be arranged at a location between the source 1 and the collimator 3.

In particular in case the charged particle blocking element is used as a current limiting aperture, it is advantageous to arrange the absorbing layer spaced apart from the at least one aperture in the substrate. Accordingly, it can be at least substantially prevented that material of the absorbing layer is arranged at the edge or overhanging the edge of the at least one aperture, or is arranged inside the at least one aperture, where said material may distort and/or disrupt a charged particle beam which traverses said at least one aperture.

In particular, the absorbing layer is arranged at a surface of the substrate which, in use, will be arranged facing the charged particle source. Accordingly, when the charged particle blocking element is used for blocking at least a part of a charged particle beam from a charged particle source, it can be arranged such that at least a large part of the blocked part of the charged particle beam impinges onto the absorbing layer. Accordingly, it is preferred that the absorbing layer is arranged in a near vicinity of the at least one aperture.

Surprisingly, the inventors have found that, when using an absorbing layer of a material comprising Boron, Carbon or Beryllium to block at least part of the charged particle beam, the heat load on charged particle optical components arranged between the charged particle blocking element and the charged particle source, is strongly reduced, as compared to a charged particle blocking element without such an absorbing layer. This holds true in particular to charged particle optical components directly adjacent the charged particle blocking element and/or having an unobstructed line of sight to the charged particle blocking element. By reducing the heat load on these charged particle optical components, the exposure apparatus can be operated during a longer period of time without the charged particle optical component becoming excessively heated and/or cooling of the charged particle optical component is less critical.

As discussed above, the primary object leading to the present invention was to reduce the heat load on components within a charged particle exposure system, for example an exposure system as described in U.S. Pat. No. 8,653,485 B2, U.S. Pat. No. 8,558,196 B2, U.S. Pat. No. 9,165,693 B2 and WO2013/171216. This was achieved by a charged particle blocking element as described herein, in particular when used in a current limiting aperture array. In addition, the inventors have found a substantial reduction of aberrations of the charged particle beams on the surface of the target when using the absorbing layer of a material comprising Boron, Carbon or Beryllium to block at least part of the charged particle beam. Hence, further to the primary effect of reducing heat load, a secondary effect of reducing aberrations of charged particle beams within the exposure system was observed. Further, both heat load as well as aberrations has been observed to be reduced even if the surface receiving the charged particle beam is only partially coated with the absorbing layer. It is however preferred that the majority of the blocked charged particle beam impinges on the absorbing layer.

The findings of the inventors seem to suggest that the heating of the components upstream of the charged particle blocking element with respect to the beam of charged particles, and a forming of space charge which may disturb charged particle trajectories, may be caused by backscattered charged particles and/or secondary electrons generated by the part of the charged particle beam which is blocked by the charged particles impinging on the charged particle blocking element. Secondary electrons may result from backscattered charged particles impinging on a surface of another element within the system. By providing an absorbing layer according to the invention on the side of the charged particle blocking element which in use receives the charged particles to be blocked, at least the amount of backscattering may be reduced.

It is noted that an absorbing layer of a material comprising Boron, Carbon or Beryllium within the context of this application also encompasses an absorbing layer of a material comprising a combination of Boron, Carbon or Beryllium with one or more other elements, such as Boron Nitride or Silicon Carbide.

Preferably, the absorbing layer comprising Boron. In particular, the absorbing layer is a Boron layer or a Boron Nitride layer. Preferably the absorbing layer is a Boron coating or a Boron Nitride coating. A coating is a thin layer, or covering, typically having a thickness of some tens or hundreds of nm, applied to the surface of an object. The Boron layer or Boron coating is preferably a substantially pure Boron layer. Boron is advantageous because it is non-toxic, is stable at room temperature, does not oxidize in air, and can be applied using known techniques such as sputtering or vapor deposition.

A disadvantage of using a Boron or Boron Nitride layer for blocking charged particles is the relatively high electrical resistivity of these materials, which makes these materials not an obvious choice when one is searching for a material for blocking a charged particles. In use, the absorbing layer will become electrically charged by the charged particles which impinge on said layer, and when using an absorbing layer of a material with a high electrical resistivity, this electrical charge is difficult to remove via electrical conduction through said absorbing layer.

A further insight underlying the present invention, apart from a measure to combine such layer with an electrically conductive layer or substrate, therefore holds that the thickness of the absorbing layer should be selected with care.

Advantageously, the absorbing layer has a thickness sufficient to prevent backscattering of said charged particles from a portion of said substrate located below said absorbing layer and thin enough for electrical charge of said charged particles to be received by said electrically conductive surface. This allows efficient absorption of charged particles, that is, a very low amount of backscattering of charged particles, while at the same time avoiding charge accumulation in the absorbing layer by removal of the absorbed electrical charge via said electrically conductive surface. Although the probability of backscattering is reduced with increasing thickness of the layer, at least up to a stabilizing threshold, increasing the thickness of the layer reduces the electrical conductivity through the thickness of the layer. If the absorbing layer becomes too thick, it will substantially act as an electrical insulator.

In an embodiment, the absorbing layer has a thickness between 100 nm to 500 nm. In a more preferred embodiment, the absorbing layer has a thickness between 150 and 250 nm. It has been observed that an absorbing layer thickness in this range provides a reduced heating of charged particle optical elements arranged between the charged particle blocking element and a charged particle source, while avoiding charge build-up in the charged particle blocking element.

In an embodiment, at least a part of the substrate is electrically conductive. This ca be realized by providing the substrate by a conductive, e.g. metallic, material, by the substrate comprising an electrically conductive material, or by a highly doped semiconductor substrate, which is highly doped at least in the area on which the absorbing layer is provided. For example, highly doped Silicon may be used. Accordingly, the substrate can assist in removing electrical charge from the absorbing layer. Preferably, the substrate comprises a connecting part for connecting the substrate to a voltage supply or to ground potential. In an embodiment, the connecting part comprises a connecting area, also referred to as contact area preferably forming part of or being arranged on a surface of said substrate, which connecting area is configured for connecting the substrate to a voltage supply or to ground potential. In particular connecting the electrically conductive substrate to ground potential enables the removal of electrical charge from the absorbing layer via electrical conduction through said substrate.

In an embodiment, the substrate is provided with an electrically conductive layer, wherein the electrically conductive layer is at least partially arranged in between the substrate and the absorbing layer. Accordingly, the electrically conductive layer can assist in removing electrical charge from the absorbing layer. Preferably, the electrically conductive layer comprises a material comprises Molybdenum (Mo) or Chromium (Cr). It may be formed by substantially pure Molybdenum or Chromium, or it may be formed of a material comprising at least one of these elements. In particular Molybdenum is preferred because Molybdenum oxide is also electrically conductive which ensures that the layer of Molybdenum is electrically conductive even when the molybdenum is at least partially oxidized. In this embodiment the substrate properties relating to electrical conductivity are of less importance. In this embodiment the substrate may be for example a semiconductor substrate having a relatively low or substantially no doping.

Since the electrically conductive layer is at least partially arranged in between the substrate and the absorbing layer, the absorbing layer can act as a protective coating for the electrically conductive layer. Accordingly, the absorbing layer can provide a protection for the electrically conductive layer against oxidation, at least for the part which is covered by the absorbing layer, which allows to also use other conductive materials for the electrically conductive layer, such as Copper (Cu) or Aluminum (Al).

Preferably, the charged particle blocking element comprises a connecting part or area which is electrically conductive and connected to the electrically conductive layer, which connecting part or area is configured for connecting the electrically conductive layer to ground potential or to a controlled voltage, to assist in the removal of electrical charge in the absorbing layer via electrical conduction through said electrically conductive layer. In an embodiment, the connecting part comprises a connecting area, also referred to as contact area, preferably forming part of or being arranged on the substrate, which connecting area is configured for connecting the electrically conductive layer to a voltage supply or to ground potential.

In an embodiment, the substrate comprises a Silicon (Si) wafer. A Si wafer provides a flat and mechanically stable substrate, which can readily be provided with apertures using etching techniques known in the art. This is in particular advantageous in applications where the charged particle blocking element is provided with a plurality of apertures. Such a charged particle blocking element can be used as a current limiting element, as will be discussed below. Since Si usually a high electrical resistance, at least when the Si is not doped, the Si wafer substrate is preferably provided with the electrically conductive layer, the absorbing layer being arranged on the electrically conductive layer, as described above.

In an embodiment, the substrate is provided with at least one aperture allowing passage of charged particles. The charged particle blocking element may be arranged within a charged particle beam path such as to allow passage of at least a portion of the charged particle beam through the at least one aperture, while enabling at least partial and/or temporary blocking of the charged particle beam by non-aperture areas on the substrate. When the aperture allows passage of only a portion, generally the central portion, of the charged particle beam while blocking the other portions of the beam, it is often referred to ad a current limiting aperture.

In an embodiment, the substrate is provided with a plurality of said apertures arranged to form one or more aperture arrays, each of said one or more aperture arrays arranged in a corresponding array area, or aperture array area, of said substrate. Such element may be used as a current limiting aperture array within a charged particle beam system. For example, it may be used for splitting a charged particle beam into a plurality of charged particle beams.

The absorbing layer preferably at least partly encloses said array areas. In some applications the charged particle beam is larger than the area encompassing the one or more aperture arrays, such that a large part of the charged particle beam blocked by the blocking element falls onto the absorbing layer even if this would not extend onto surface areas located between individual apertures or array areas. Such embodiment may be easier to manufacture, avoiding parts of the absorbing layer extending into the apertures. As mentioned above, such partial coverage of the charged particle receiving surface by the absorbing layer has been observed to provide a substantial reduction in heating of components and/or aberrations of charged particle beams.

In further embodiments, each array area is at least partly enclosed by said absorbing layer. In still further embodiments, the absorbing layer is further arranged at least partly within each aperture array area. This may increase the portion of the charged particle beam being absorbed by the charged particle blocking element.

In an embodiment, the charged particle blocking element comprises cooling conduits for cooling at least the substrate. Preferably, the cooling conduits are arranged in thermal contact with the absorbing layer and/or the substrate. Accordingly, the charged particle blocking element can be provided with cooling conduits for guiding a cooling fluid (such as water) through said cooling conduits for removing heat from the charged particle blocking element. In an embodiment, the cooling conduits are arranged at a surface of the substrate facing away from the absorbing layer. In an embodiment of use in a charged particle beam system, the cooling conduits are arranged at a surface of the substrate facing away from the charged particle source.

In an embodiment, the substrate is provided with a further electrically and/or heat conductive layer, wherein the further electrically and/or heat conductive layer is arranged in contact with the absorbing layer and with the cooling conduits. A heat conductive layer provides a heat conducting path from the absorbing layer to the cooling conduits. This embodiment allows using a substrate of a material having poor heat conducting properties. A further electrically conductive layer provides an electrically conducting path from the absorbing layer to the cooling conduits. Accordingly, the further electrically conductive layer can assist in removing electrical charge from the absorbing layer via the cooling conduits, which are usually connected to ground potential when in use in an exposure apparatus. In addition, by electrically connecting the absorbing layer to the cooling conduits no dedicated contact area or contact arrangement is necessary at the side of the charged particle blocking element facing away from the side comprising the cooling conduits. Accordingly, the side of the charged particle blocking element facing away from the side comprising the cooling conduits can be arranged very close to an adjacent element or component of a charged particle optical arrangement.

According to a second aspect, the present invention provides a current limiting element for use in a charged particle exposure apparatus, said current limiting element comprising a substrate not allowing transmission of charged particles, said substrate provided with one or more apertures extending through said substrate from a first surface to a second surface of said substrate, said one or more apertures allowing passage of charged particles, wherein at least a portion of said first surface is provided with an absorbing layer comprising Boron (B), Carbon (C) or Beryllium (Be), wherein the absorbing layer is arranged spaced apart from the one or more apertures, and wherein said absorbing layer is provided on an electrically conductive material or electrically conductive surface.

It is noted that a current limiting element is usually used for limiting the current in a charged particle beam. Accordingly the diameter of the one or more apertures is smaller than the diameter of the charged particle beam. Since the current limiting element at least partially defines the cross section of the charged particle beam that has traversed said current limiting element, the apertures are usually precisely manufactured. By arranging the absorbing layer spaced apart from the one or more apertures, any disturbances at least at the edge of the one or more apertures at least by the absorbing layer can be avoided.

The current limiting element according to the second aspect provides the same or corresponding technical effects and advantages as the charged particle blocking element according to the first aspect described herein above. The charged particle blocking element of the first aspect, according to embodiments where the substrate is provided with one or more apertures, may be used as the current limiting element according to the second aspect.

The current limiting element according to the second aspect may be combined with one or more of the embodiments and/or alternatives of the charged particle blocking element according to the first aspect.

According to a third aspect, the present invention provides a shutter element for at least temporarily blocking a charged particle beam, the shutter element comprising a substrate, at least a portion of which is provided with an absorbing layer comprising Boron (B), Carbon (C) or Beryllium (Be), wherein said absorbing layer is provided on an electrically conductive surface on said substrate.

It noted that a shutter element in use is arranged for temporarily allowing a charged particle beam to pass the shutter element and for temporarily blocking the charged particle beam.

In the situation where the charged particle beam is allowed to pass the shutter element, the charged particle beam passes at least along an edge or through an aperture of said shutter element. When the shutter element is this situation is configured to act also as a current limiting element, the absorption layer is preferably arranged spaced apart from the edge or the aperture. However, when the shutter element in this situation is configured not to act as a current limiting element, in particular when the charged particle beam is spaced apart from the edge or the circumference of the aperture, the absorption layer may be arranged up to the edge or up to the circumference of the aperture.

The shutter element may be realized by the charged particle blocking element of the first aspect.

The shutter element of the third aspect may be combined with one or more of the embodiments and/or alternatives of the charged particle blocking element according to the first aspect.

According to a fourth aspect, the present invention provides an exposure apparatus for projecting a charged particle beam onto a target, said exposure apparatus comprising a charged particle optical arrangement for forming a charged particle beam and for projecting the charged particle beam onto the target, wherein the charged particle optical arrangement comprises a charged particle source for generating the charged particle beam and a charged particle blocking element according to the first aspect, which charged particle blocking element enables blocking at least a part of the charged particle beam from the charged particle source, a current limiting element according to the second aspect arranged to limit a charged particle current of said charged particle beam, and/or a shutter element according to the third aspect.

In an embodiment, the absorbing layer of the charged particle blocking element, the current limiting element, and/or the shutter element is arranged at a surface of the substrate facing towards the charged particle source and/or a source of backscattered and/or secondary electrons within the apparatus.

In an embodiment, the charged particle blocking element comprises one or more apertures arranged as a current limiting aperture or current limiting aperture array of the exposure apparatus.

In an embodiment, the charged particle blocking element and/or the current limiting element comprises an array of apertures for splitting the charged particle beam into multiple charged particle beams. Accordingly, the charged particle blocking element and/or the current limiting element can be used for generating multiple charged particle beams from a single large diameter beam. Typical applications are charged particle multi-beam lithography systems, charged particle multi-beam inspection systems, and charged particle multi-beam microscopes.

In an embodiment, the charged particle optical arrangement comprises a modulation deflector for deflecting the charged particle beam onto the charged particle blocking element, wherein the modulation deflector and the charged particle blocking element are arranged to allow the charged particle beam to pass the aperture of the charged particle blocking element when the charged particle beam is not deflected by the deflector, and to at least partially block the charged particle beam by the charged particle blocking element when the charged particle beam is deflected by the deflector, or vice versa. Accordingly, the charged particle blocking element of this embodiment is used for modulating a charged particle beam, in particular for an on or off switching of a charged particle beam. Typical applications are charged particle (multi-) beam lithography systems.

According to a fifth aspect, the present invention provides a charged particle lithography system comprising an exposure apparatus or an embodiment thereof as described above.

According to a sixth aspect, the present invention provides a charged particle inspection system or charged particle microscope comprising an exposure apparatus or an embodiment thereof as described above.

According to a seventh aspect, the present invention provides a method of projecting a charged particle beam onto a target using an exposure apparatus as described above, wherein the method comprises the step of blocking at least a part of the charged particle beam from the charged particle source, wherein at least a part of the charged particle beam that is blocked falls onto the absorbing layer of the charged particle blocking element or the current limiting element.

According to a eighth aspect, the present invention provides a method of manufacturing a semiconductor device by means of an exposure apparatus as described hereinbefore, the method comprising the steps of:

placing a wafer downstream of said charged particle optical arrangement;

processing said wafer including projecting an image or a pattern on said wafer by means of a charged particle beam generated, shaped and/or modulated by said charged particle optical arrangement; and performing subsequent steps in order to generate a semiconductor device by means of said processed wafer.

The subsequent steps of manufacturing a semiconductor device from said processed wafer are known in the technical field of manufacturing semiconductor devices. A number of said subsequent steps are for example described in the United States patent application No. US 2014/0176920 A1 of the Applicant.

According to a ninth aspect, the present invention provides a method for inspecting a target by means of an exposure apparatus a described hereinbefore, the method comprising the steps of:

positioning said target downstream of said charged particle optical arrangement;

directing a charged particle beam generated and shaped by said charged particle optical arrangement towards said target;

detecting charged particles transmitted, emitted and/or reflected by said target upon incidence of the charged particle beam on the target; and performing subsequent steps in order to inspect said target by means of data from the step of detecting charged particles.

The different embodiments described above can be combined. The various aspects and features described and shown in the specification can be applied individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of exemplary embodiments shown in the attached drawings, in which.

DETAILED DESCRIPTION OF THE INVENTION

Figure 1:
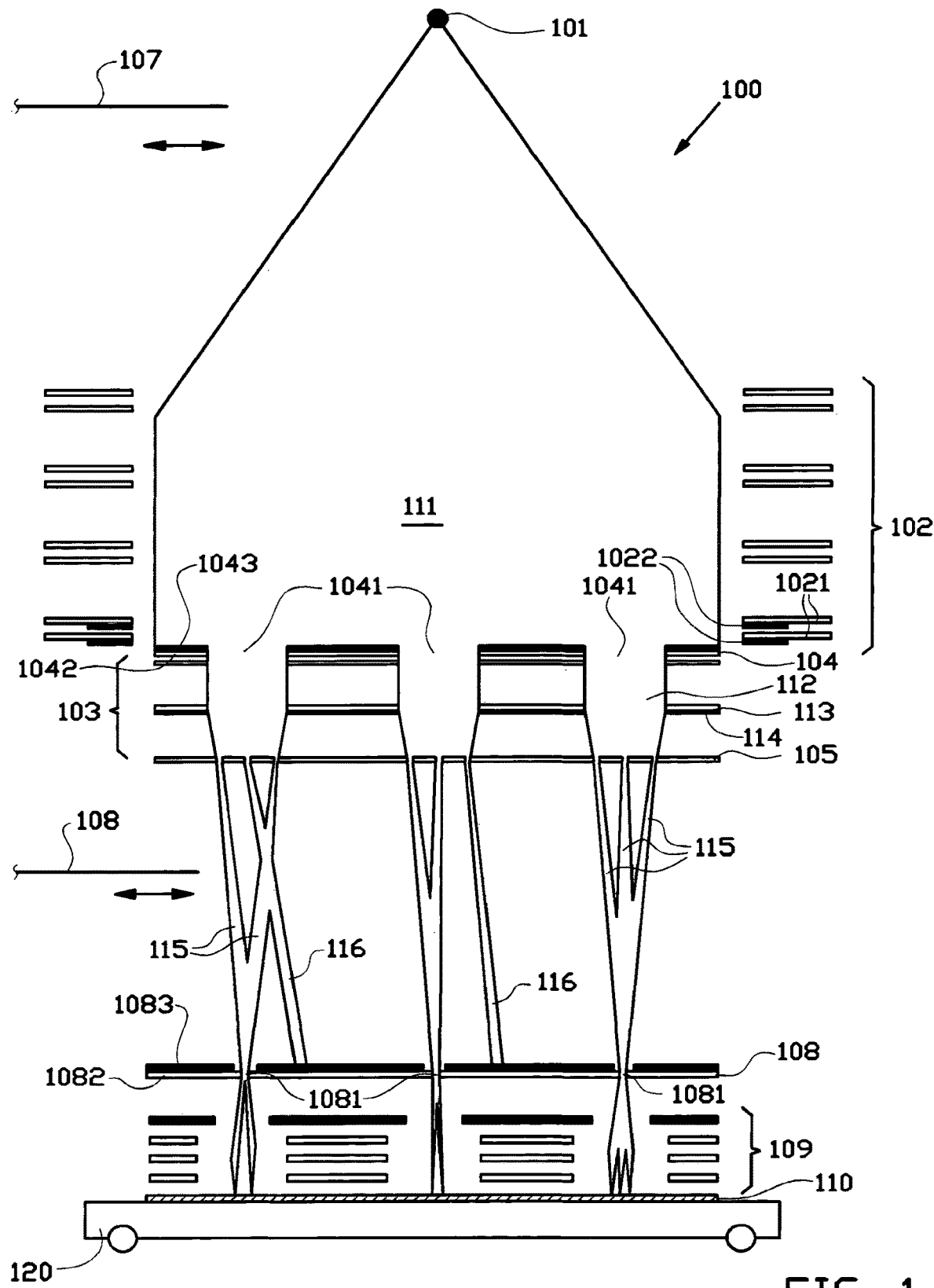
FIG. 1 shows a schematic overview of an exposure apparatus according to an embodiment of the invention.

FIG. 1 shows a schematic overview of an example of an exposure apparatus 100 for projecting one or more charged particle beams onto a target 110. Such an exposure apparatus may be part of a charged particle multi-beam lithography system, a charged particle multi-beam inspection system, or a charged particle multi-beam microscope. In particular it may be an electron beam system, although the teaching applies to other types of charged particles as well.

The exposure apparatus 100 as shown in FIG. 1 comprises a charged particle optical arrangement comprising a charged particle source 101 for generating a charged particle macro beam 111. The charged particle source 101 in this particular example is arranged for generating a diverging charged particle macro beam which is directed to a collimator lens 102 for focusing and/or collimating the charged particle macro beam 111. In some embodiments the charged particle source 101 is an electron source.

Downstream the collimator lens 102, the charged particle optical arrangement comprises an aperture array element 104 which comprises an array of apertures 1041 for splitting the charged particle macro beam 111 into a plurality of charged particle beams 112. The aperture array 104 comprises a charged particle blocking element according to the invention, which in this embodiment is a current limiting element. The charged particle blocking element comprises a substrate 1042 comprising the array of apertures 1041 and is provided with an absorbing layer 1043 comprising Boron, Carbon or Beryllium. The absorbing layer 1043 is arranged on a surface of the substrate 1042 which is facing the charged particle source 101. As schematically shown in FIG. 1, the collimated macro beam 111 impinges on the aperture array element 104, in particular on the absorbing layer 1043 thereof, which blocks part of the collimated macro beam 111 while forming the plurality of charged particle beams 112 by the part of the macro beam passing through the apertures 1041. In the example of FIG. 1, only three beams 112 have been depicted for clarity reasons, but the number of beams is generally in the range of hundreds, thousands or even ten-thousands.

The charged particle blocking element according to the invention has been found to be particularly advantageous in use as a current limiting element, in particular with the aperture array element 104 as described above. Alternatively or additionally, the charged particle blocking element may be applied at other locations within the apparatus, as will be described below.

Further towards the target 110, the charged particle optical arrangement comprises a modulation aperture array 105 for generating a plurality of charged particle sub-beams 115 from each of the charged particle beams 112. In between the aperture array 104 and the modulation aperture array 105, a condenser lens array 103 (or set of condenser lens arrays) is provided for focusing the charged particle beams 112 on a corresponding opening in a beam stop array 108 located downstream the modulation aperture array 105.

In this example, the aperture array 105 is illustrated as producing three sub-beams 115, 116 from each charged particle beam 112. In practice the number of sub-beams 115 which are generated from each charged particle beam 112 are generally much larger than three. In a practical embodiment around fifty sub-beams (for example 49 sub-beams generated by a 7×7 aperture array) are generated from each charged particle beam 112. In other embodiments two hundred or more sub-beams may be generated.

The modulation aperture array 105 may also comprise a charged particle blocking element or current limiting element according to the invention. This is, however, not shown in detail in FIG. 1.

The modulation aperture array 105, which is part of the charged particle optical arrangement, comprises an array of deflectors which are configured for individually deflecting the charged particle sub-beams 116 such as to be blocked by the beam stop array 108 or for allowing the charged particle sub-beams 115 to pass through the corresponding aperture of the beam stop array 108 undeflected.

The beam stop array 108 comprises an array of apertures 1081, which are arranged to allow the charged particle sub-beams 115 to pass when not deflected by the modulation aperture array 105. The charged particle sunbeams 116 which are deflected by the modulation aperture array 105 are directed on to the surface of the beam stop array 108 facing the charged particle source 101, such as to be blocked by the beam stop array 108. In this example, the beam stop array 108 comprises a charged particle blocking element according to the invention, which comprises a substrate 1082 comprising apertures 1081 and being provided with an absorbing layer 1083 of a material comprising Boron, Carbon or Beryllium. The absorbing layer 1083 is arranged on a surface of the substrate 1082 which is facing the charged particle source 101 and which receives the sub-beams 116 to be blocked. As schematically indicated in FIG. 1, the absorbing layer 1083 is arranged spaced apart from, and in near vicinity of, the apertures 1081 of the beam stop array 108.

Subsequently, the charged particle optical arrangement comprises a projection lens or projection lens array 109 for projecting the charged particle sub-beams 115, which have passed the beam stop array 108, onto the surface of a target 110. The charged particle optical arrangement may further comprise one or more scanning deflector arrays (not shown) for scanning the sub-beams 115 over the surface of the target 110 while exposing said target 110.

In a charged particle multi-beam lithography system, a charged particle multi-beam inspection system, or a charged particle multi-beam microscope, the target 110 is usually arranged on top of a stage 120, which allows accurately positioning and moving the target 110 with respect to the charged particle optical arrangement.

As clearly indicated in FIG. 1, the substrates 1042, 1082 with an absorbing layer 1043, 1083 are arranged for blocking at least a part of the charged particle beam 111, 116 from the charged particle source 101, wherein the at least a part of the charged particle beam 111, 116 that is blocked falls at least partially onto the absorbing layer 1043, 1083 of the charged particle blocking element. Accordingly, the total current in the charged particle beam(s) above the charged particle blocking elements is higher than the total current in the charged particle beam(s) below the charged particle blocking elements. The charged particle blocking elements, in particular the aperture array 104, the modulation aperture array 105, and the beam stop array 108, are current limiting elements of the exposure apparatus 1.

In some embodiments the collimator lens 102, at least the part thereof which is close to the aperture array 104, may comprise a charged particle blocking element according to the invention, which comprises a substrate 1021 provided with an absorbing layer 1022 and comprising at least one aperture for passage of the macro beam 111. In the illustrated embodiment, the absorbing layer 1022 is arranged on a surface of the substrate 1021 facing the aperture array 104, since this in use may function as a charged particle source for backscattered charged particles from the part of the charged particle beam which does not pass through apertures 1041 and/or for secondary electrons which may be created in the charged particle optical arrangement by incidence of the charged particle beam 111 on the aperture array element 104, e.g. by these charged particles being backscattered and impinging on other components within the system.

Also the condenser lens array 103, at least the part thereof which is closest to the modulation aperture array 105, may comprise a charged particle blocking element according to the invention, which comprises a substrate 113 comprising at least one aperture and an absorbing layer 114 of Boron, Carbon or Beryllium. The absorbing layer 114 is arranged on a surface of the substrate 113 which is facing the modulation aperture array 105, which in use may function as a source of backscattered and/or secondary electrons which may be created in the charged particle optical arrangement upon incidence of the charged particle beams 112 on the modulation aperture array 105.

Further, the charged particle blocking element may be used as a shutter 107, arranged between the charged particle source 101 and the collimator lens 102, in a substantially horizontally moveable way, to function as a source shutter. In this case the charged particle blocking element is typically not provided with an aperture. By moving it into the charged particle beam path the charged particle beam from the charged particle source 101 is blocked, enabling temporarily shutting off the charged particle beam without turning off the charged particle beam source, e.g. during position adjustment and/or replacement of elements downstream the charged particle source.

The charged particle blocking element may also be used as a shutter 108, functioning as a beam shutter, located between the modulation aperture array 105 and the beam stop array 108. Such shutter finds application in blocking one or more groups of beams 115, 116, for example in case of a non-optimally functioning modulation aperture array 105. This shutter may be realized by a charged particle blocking element not provided with apertures, and may be entered into the charged particle beam paths to shut off one or more groups of charged particle beams 115, 116. Alternatively, the charged particle blocking element may be provided with one or more apertures, enabling selectively blocking one or more groups of charged particle beams 115, 116 while allowing passage of other groups of charged particle beams 115, 116.

Figure 2:
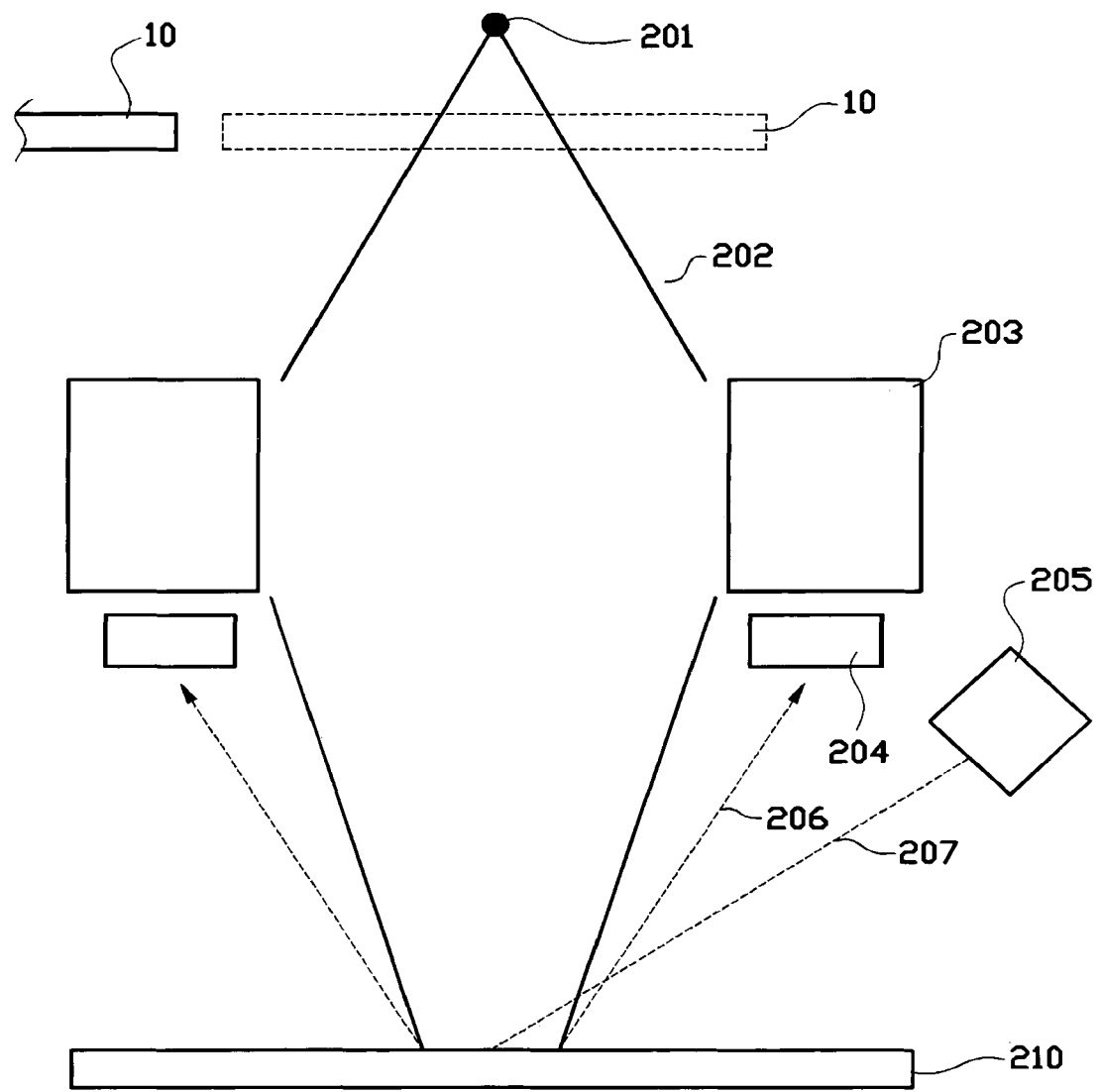
FIG. 2 shows a schematic overview of a microscope or inspection apparatus according to an embodiment of the invention.

FIG. 2 schematically shows a charged particle inspection system or microscope, for example an electron microscope, comprising a charged particle blocking element according to the invention. Such microscopes and inspection systems have a wide range of applications, e.g. in semiconductor device manufacturing. The apparatus comprises a charged particle source 201 generating a charged particle beam 202 and charged particle optics 203 projecting the charged particle beam 202 onto a target 210, also referred to as sample, which is to be inspected or analyzed. The target 210 is typically arranged on a stage (not shown) which is movable with respect to the charged particle optics 203. The charged particle optics 203 comprises various charged particle optical elements and components, including electrostatic and/or electromagnetic lens elements, for influencing the charged particle beam, as known in the art. In some systems the charged particle beam 202 is split into a plurality of individual beams (not shown), which are directed onto the target. One or more different detectors 204, 205 are provided for detecting various signals 206, 207 resulting from the interaction of the charged particle beam with the target 210. Such signals encompass, for example, secondary electrons, Auger electrons, backscattered charged particles, X-rays, cathodoluminescence, etc.

The inspection system further comprises a shutter element 10, realized by a charged particle blocking element according to the invention. The shutter element 10 is arranged for temporarily shutting off the charged particle source. Alternatively or additionally, the charged particle blocking element of the invention can be provided within the charged particle optics 203, for example as a current limiting element. Alternatively or additionally, a shutter element 10 may be arranged for temporarily closing off the charged particle optics and/or detector area from a target space.

Examples of known inspection systems and/or electron microscopes can be found in U.S. Pat. No. 7,732,762 B2, U.S. Pat. No. 6,844,550 B1, and A. L. Eberle et al., "High-resolution, high-throughput imaging with a multibeam scanning electron microscope", Journal of Microscopy, Vol. 259, Issue 2, 2015, pp. 114-120. In accordance with the above, in these systems the charged particle blocking element according to the invention might be used, for example as a shutter downstream the electron source or electron gun, and/or as aperture array, beam splitter or beam limiting aperture.

Various embodiments of the charged particle blocking element according to the invention are illustrated in FIGS. 3-10 and described below. The charged particle blocking elements described with reference to FIGS. 1-2 may be charged particle blocking elements according to any one or more of these embodiments.

Figure 3:
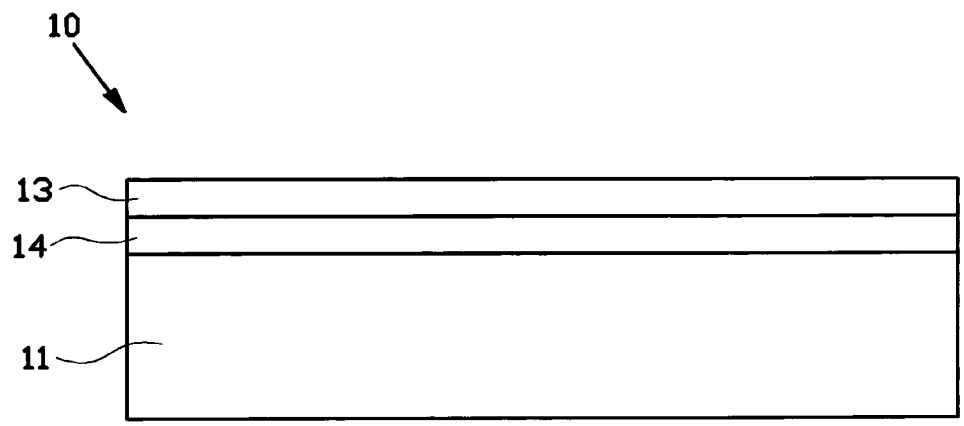
FIG. 3 shows a schematic cross section of an embodiment of a charged particle blocking element according to the invention, FIG. 4 schematically illustrates blocking of a charged particle by a charged particle blocking element.

FIG. 3 shows a schematic cross section of a charged particle blocking element 10 according to an embodiment. The charged particle blocking element 10 comprises a substrate 11 having an electrically conductive surface on which an absorbing layer 13 is provided. In the illustrated embodiment, the electrically conductive surface is provided by an electrically conductive layer 14 applied on a surface of the substrate 11. The absorbing layer 13 is subsequently applied on the conductive layer 14. The absorbing layer 13 advantageously is a Boron layer or a Boron Nitride layer, although other materials for example comprising Carbon (C) or Beryllium (Be) can also be used. The substrate 11 may be a silicon substrate, and the electrically conductive layer 14 a Molybdenum layer.

Figure 4:
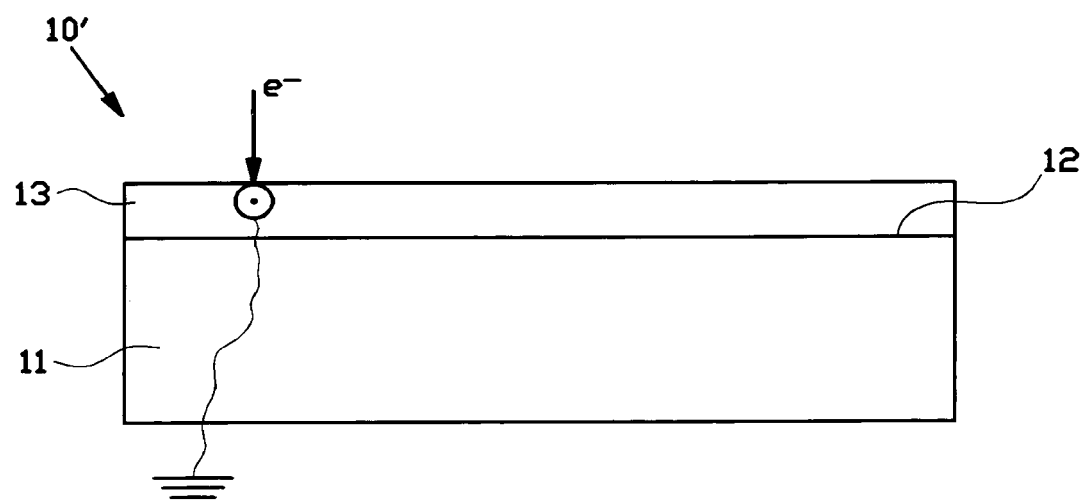

As discussed above, the thickness of the absorbing layer is important. FIG. 4 schematically illustrates a path of an electron impinging on a charged particle blocking element comprising an electrically conductive substrate 11 provided with an absorbing layer 13. An analogous situation applies to the element illustrated in FIG. 3. The electron e⁻ impinges on the surface of the charged particle blocking element 10'. As the electron e⁻ impinges on the absorbing layer 13, it may be absorbed by this layer. As the electron is absorbed, it enters into the absorbing layer. In order for the electron to more likely be absorbed into the layer than backscattered by the underlying surface 12 the absorbing layer has, to be sufficiently thick. In order to avoid charge accumulation in the absorbing layer 13 as a result of the absorption of the electron, the charge must be removed from the absorbing layer. As described above, a layer comprising for example Boron is typically a poor conductor. If the layer is sufficiently thin, the electron charge will pass through the absorbing layer and reach the surface 12 of the electrically conductive substrate 11, which in the example is connected to electric ground. The possibility of charge transport through the absorbing layer to the underlying electrically conductive surface decreases with increasing thickness of the absorbing layer. The inventors have found that a thickness of the absorbing layer should be of a few hundred nanometers, for example around 200 nm.

Figure 5:
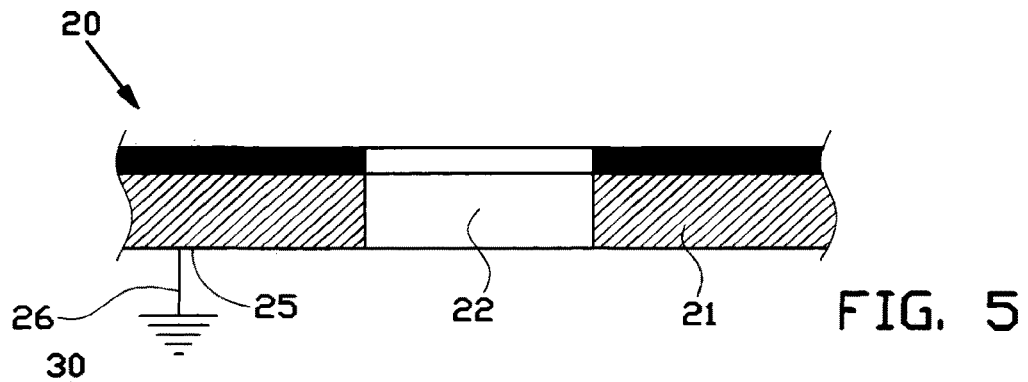
FIG. 5 shows a schematic cross-section of an embodiment of a part of a charged particle blocking element according to the invention.

FIG. 5 shows a schematic cross-section of a charged particle blocking element 20. This charged particle blocking element can for example be used for blocking at least a part of a charged particle beam from a charged particle source. The charged particle blocking element 20 can be used as a current limiting element, the aperture 22 functioning as a current limiting aperture. The charged particle blocking element 20 comprises a substantially flat substrate 21 comprising at least one aperture 22. The substrate 21 is provided with an absorbing layer 23 of a material comprising Boron, Carbon or Beryllium. Preferably, the absorbing layer 23 is a coating of Boron, Boron Nitride or Silicon Carbide. The absorbing layer 23 is arranged to substantially cover an area on said substrate 21 which area at least comprises a part of said substrate which in use is arranged facing the charged particle source 101, for example on the aperture array 104 and/or on the beam stop array 108 of FIG. 1, or facing the aperture array 104 or the modulation aperture array 105, for example as a part of the collimator lens 102 and/or as a part of the condenser lens array 103, respectively.

The substrate 21 according to this embodiment comprises an electrically conductive material, which enables the removing of electrical charge from the absorbing layer 23. In use, such a substrate 21 is suitably connected to a controlled electrical potential or to ground potential 26 via a connecting part 25, to enable the removal of electrical charge in the absorbing layer 23 via electrical conduction through said substrate 21. It is noted that the electrically conductive material within the meaning of this embodiment may also comprise a highly doped semiconductor material. Accordingly, the substrate 21 may comprise a highly doped Silicon wafer, for example.

Figure 6:
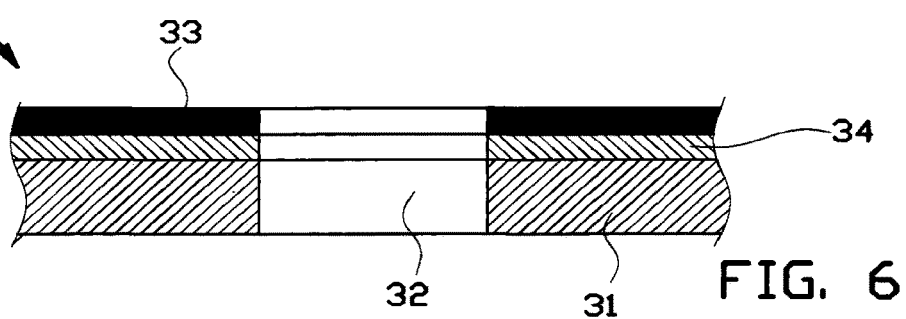
FIG. 6 shows a schematic cross-section of a further embodiment of a part of a charged particle blocking element according to the invention.

FIG. 6 shows a schematic cross-section of a charged particle blocking element 30 according to another embodiment. The charged particle blocking element 30 comprises a substantially flat substrate 31 comprising at least one aperture 32. The substrate 31 is provided with an absorbing layer 33 of a material comprising Boron, Carbon or Beryllium. Preferably the absorbing layer 23 is a coating of Boron, Boron Nitride or Silicon Carbide. The absorbing layer 33 is arranged to substantially cover an area on said substrate 31 which area at least comprises a part of said substrate, and may in use be arranged in a similar manner as described for the charged particle blocking element of FIG. 5.

The charged particle blocking element 30 according to this embodiment is provided with an electrically conductive layer 34. The electrically conductive layer 34 is arranged in between the substrate 31 and the absorbing layer 33. In use, the electrically conductive layer 34 is connected to ground potential 36, or to a controlled electrical potential, via a connecting part 35, as schematically shown in the charged particle blocking element 30 with multiple apertures 32 of FIG. 7. Connecting the electrically conductive layer 34 to ground potential 36 enables the removal of electrical charge from the absorbing layer 33 via electrical conduction through the electrically conductive layer 34. The electrically conductive layer 34 comprises, for example, Molybdenum or Chromium. Although only one aperture 32 is illustrated in FIG. 6, the charged particle blocking element may comprise a plurality of apertures 32 as illustrated in FIG. 7.

Figure 7:
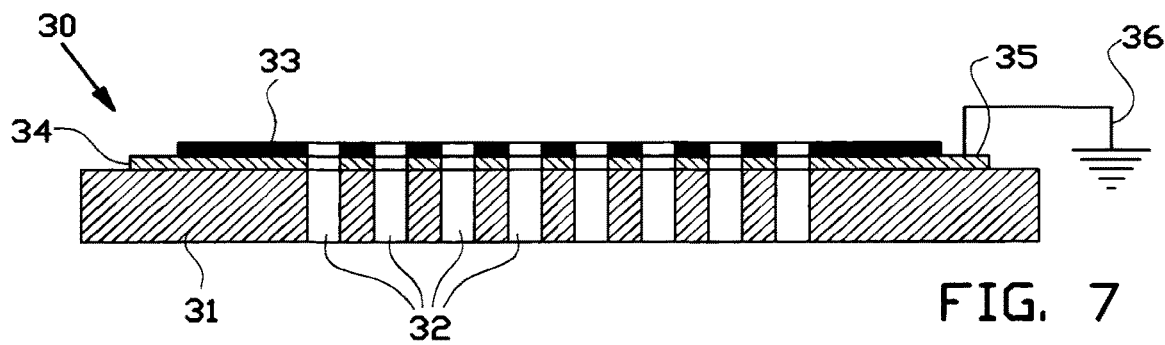
FIG. 7 shows a second schematic cross-section of the charged particle blocking element according to the embodiment of FIG. 6.

In particular for a charged particle blocking element 30 with multiple apertures 32, as schematically shown in FIG. 7, it is desirable that the substrate 31 comprises a Si wafer, which is readily available and provides a highly flat and mechanically robust substrate with a well-defined thickness.

Figure 8:
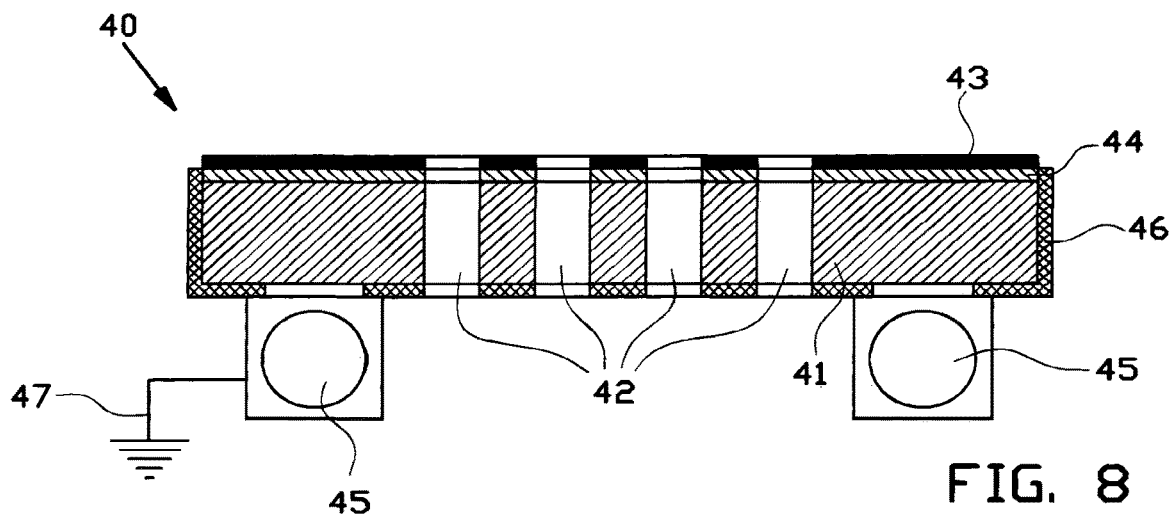
FIG. 8 shows a schematic cross-section of a charged particle blocking element provided with cooling channels according to an embodiment.

FIG. 8 shows a further embodiment of a charged particle blocking element 40. The charged particle blocking element 40 comprises a substantially flat substrate 41 comprising at least one aperture 42, preferably a plurality of apertures 42. The substrate 41 is provided with an absorbing layer 43 of a material comprising Boron, Carbon or Beryllium, preferably a coating of Boron, Boron Nitride or Silicon Carbide. The absorbing layer 43 is arranged to substantially cover an area on said substrate 41 which area at least comprises a part of said substrate, and is in use typically arranged in a similar manner as described for the charged particle blocking elements of FIG. 5.

The charged particle blocking element 40 according to this embodiment is provided with one or more cooling conduits 45 for cooling the substrate 41. The cooling conduits 45 are arranged in thermal contact with the substrate 41 and/or with a further electrically and/or thermally conductive layer 46.

The further conductive layer 46 is arranged in contact with the absorbing layer 43 and with the cooling conduits 45 and may comprise a material having a high thermal conductivity to provide a heat conducting path from the absorbing layer 43 to the cooling conduits 45.

In addition or alternatively, the further conductive layer 46 may comprise a material with a high electrical conductivity to provide an electrically conducting path from the absorbing layer 43 and/or from the electrically conductive layer 44 which is arranged between the substrate 41 and the absorbing layer 43, to the cooling conduits 45, which in use are connected to ground potential 47.

As schematically shown in FIG. 8, the cooling conduits 45 are arranged at a side of the substrate 41 facing away from the absorbing layer 43. However, the cooling conduits 45 can also be arranged at the same side of the substrate 41 as the absorbing layer 43, preferably at a position spaced apart from the apertures 42. In such an arrangement the absorbing layer 43 can be arranged in direct contact with the cooling conduits 45 and a further conductive layer 46 as in the example of FIG. 8 is not necessary.

Figure 9:
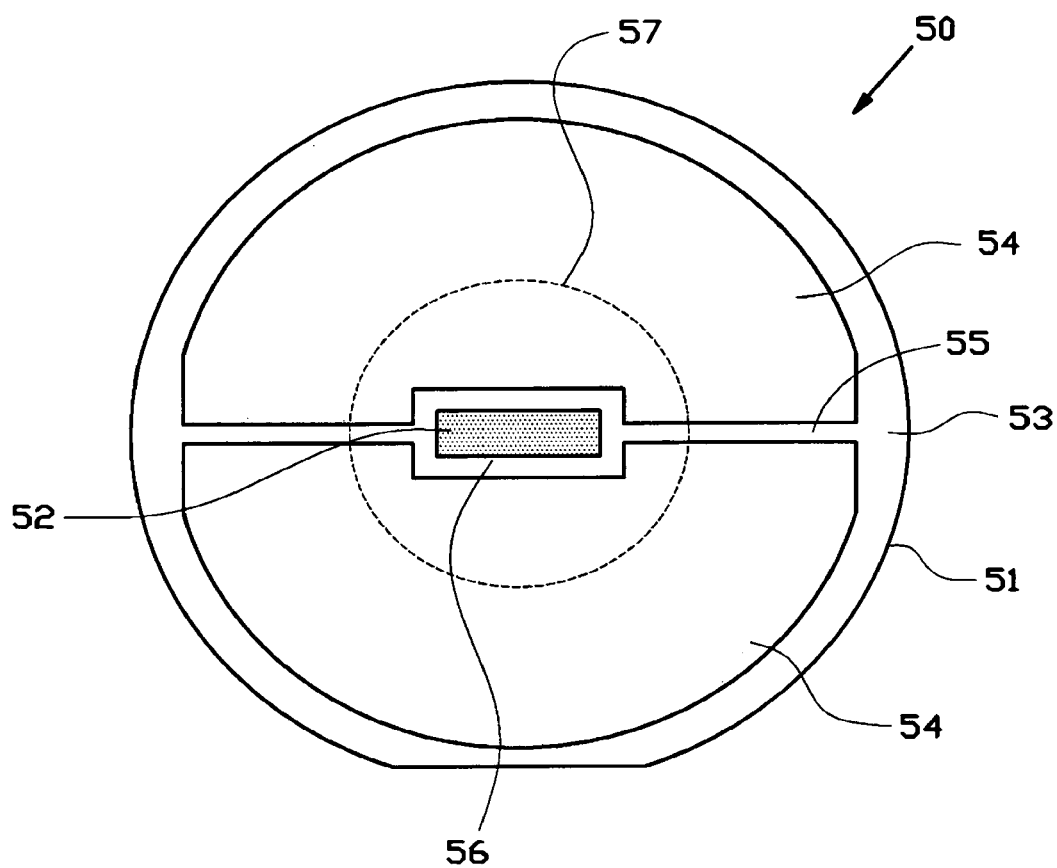
FIG. 9 shows a schematic top-view of an embodiment of a charged particle blocking element according to the invention.

FIG. 9 shows a schematic top-view of an embodiment of a charged particle blocking element 50 according to the invention. The charged particle blocking element 50 comprises a substantially flat substrate 51 comprising an array 56 of apertures arranged in an array area 52. The substrate 51 is a Silicon wafer which is provided with a coating 53 of Molybdenum as an electrically conductive layer. On top of the Molybdenum coating 53, a coating of Boron 54 is arranged as an absorbing layer. As schematically shown in FIG. 9, the absorbing layer, in particular the boron coating 54, is arranged spaced apart from the apertures of the aperture array 56. In particular, the boron coating 54 is arranged spaced apart from the array area 52. The absorbing layer 54 may be arranged as one single area, or it may be provided by a plurality of areas separated by parts 55 of the electrically conductive coating 53 not covered by an absorbing layer or coating.

In an embodiment of the invention, the charged particle blocking element 50 is used as an aperture array element 104 forming a plurality of charged particle beams from a macro-beam, in particular as the aperture array element 104 of a charged particle exposure system 100. An example of a cross section of the macro-beam 111 on the charged particle blocking element 50 when used as an aperture array element 104 is indicated by the circle 57. As can be seen, a large part of the beam falls on an area covered by the absorbing layer 54. That is, a large part of the blocked part of the charged particle beam impinges on the absorbing layer 54, to be absorbed by this.

Figure 10A:
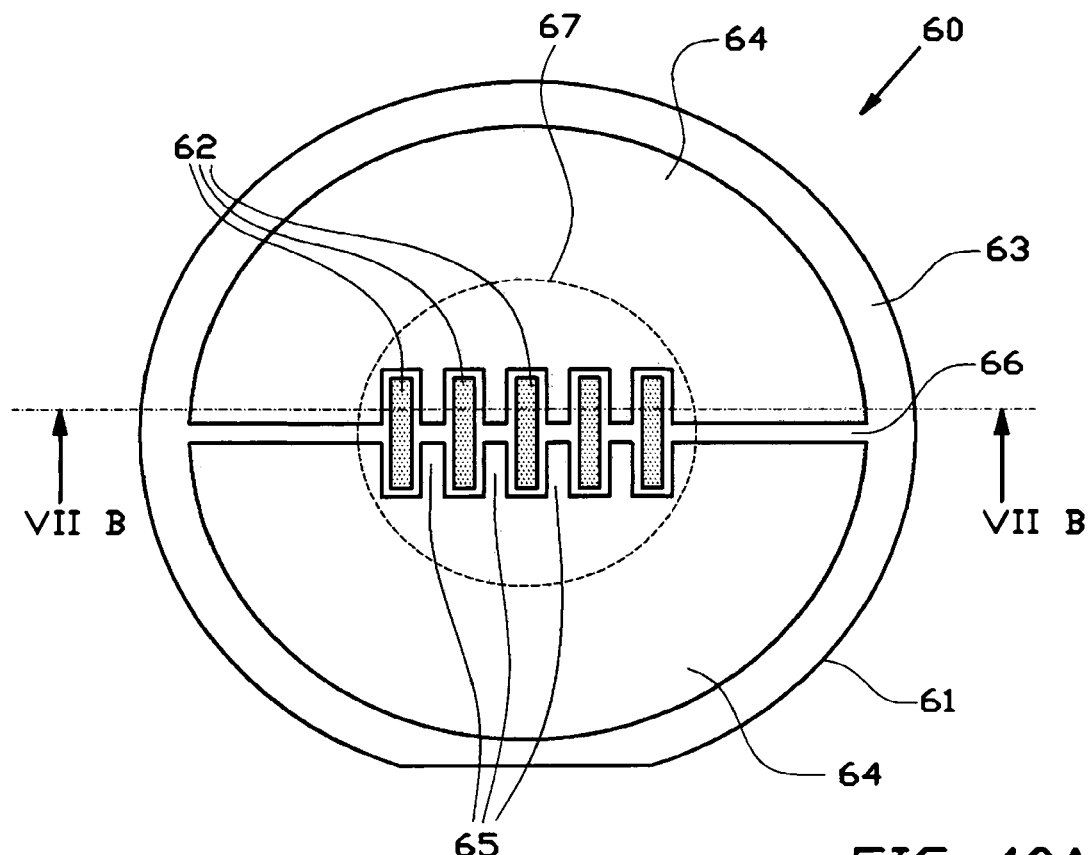
FIG. 10A shows a schematic top-view of a further embodiment of a charged particle blocking element according to the invention.
Figure 10B:
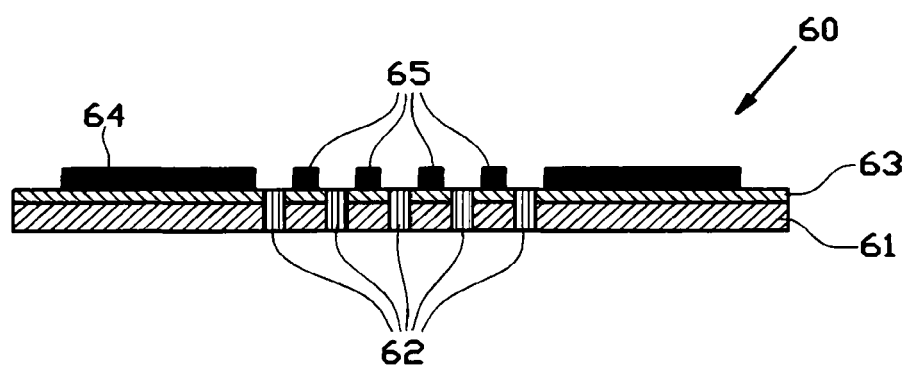
FIG. 10B shows a schematic cross-section along the line VII-VII in FIG. 10A, FIG. 11 schematically illustrates a method of manufacturing a semiconductor device, and FIG. 12 schematically illustrates a method of inspecting a target.

FIG. 10A shows a schematic top-view of a further embodiment of a charged particle blocking element 60 according to the invention. FIG. 10B shows a schematic cross section along the line VII-VII in FIG. 10A.

The charged particle blocking element 60 comprises a substantially flat substrate 61 comprising a plurality of arrays of apertures arranged in different array areas 62. The substrate 61 is a Silicon wafer which is provided with a coating 63 of Molybdenum as an electrically conductive layer. On top of the Molybdenum coating 63, a coating of Boron 64 is arranged as an absorbing layer. As schematically shown in FIGS. 10A and 10B, the absorbing layer 64, is arranged spaced apart from the apertures of the aperture array. In particular, the boron coating 64 is arranged space apart from the array areas 62. As schematically indicated in FIGS. 10A and 10B, the boron coating 64 also at least partially extends in areas 65 in between the array areas 62.

The absorbing layer 64 may be arranged as one single area, or it may be provided by a plurality of areas separated by parts 66 of the electrically conductive coating 63 not covered by an absorbing layer or coating.

This charged particle blocking element 60 may for example be used as an aperture array splitting a charged particle macro beam into a plurality of charge particle beams. In an embodiment of the present invention, it is employed in the aperture array element 104 of a charged particle exposure system as illustrated in FIG. 1. An example of a cross section of the macro-beam 111 on the charged particle blocking element 60 when used as an aperture array 104 is indicated by the circle 67. As can be seen, a large part of the blocked beam is blocked by the absorbing layer 64.

Figure 11:
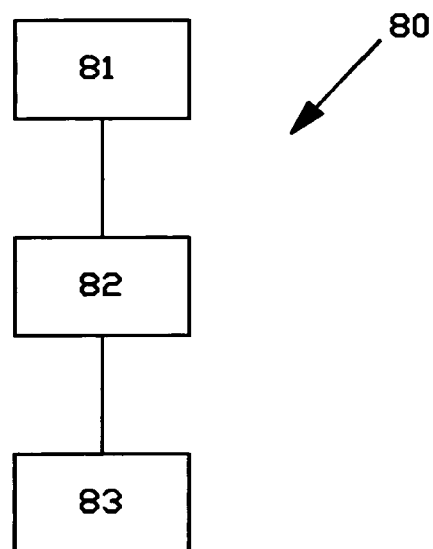

FIG. 11 schematically illustrates the steps of a method 80 of manufacturing a semiconductor device by means of an exposure apparatus as described above. In a first step 81, the wafer is placed downstream of said charged particle optical arrangement. In a second step 82 the wafer is processed, including projecting an image or a pattern on said wafer by means of a charged particle beam generated, shaped and/or modulated by said charged particle optical arrangement. In a third step 83 subsequent steps are performed in order to generate a semiconductor device from the processed wafer. Such subsequent steps are known in the art.

Figure 12:
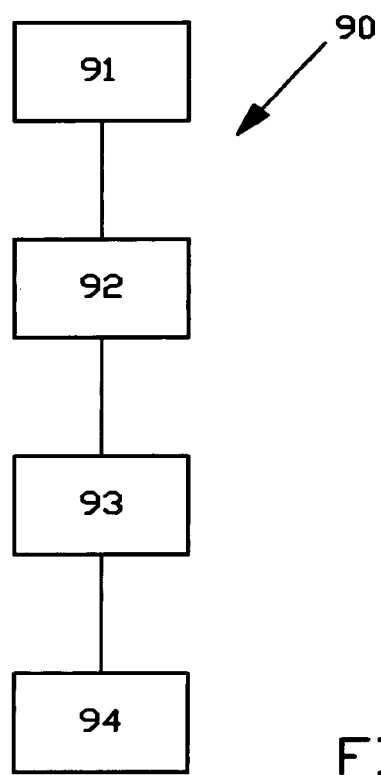

FIG. 12 schematically illustrates the steps of a method 90 for inspecting a target by means of an exposure apparatus or inspection system as described above. In a first step 91 the target is positioned downstream the charged particle optical arrangement, and in a second step 92 a charged particle beam generated and shaped by said charged particle optical arrangement is directed towards the target. In a third step 93 charged particles transmitted, emitted and/or reflected by said target upon incidence of the charged particle beam on the target are detected. In the fourth step 94 subsequent steps are performed in order to inspect said target by means of data gathered during the step of detecting charged particles.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

CLAUSES

C1. A charged particle blocking element for blocking charged particles, wherein the charged particle blocking element comprises a substrate, wherein at least a portion of a surface of the substrate is provided with an absorbing layer comprising Boron (B), Carbon (C) or Beryllium (Be), wherein said absorbing layer is provided on an electrically conductive surface.

C2. The charged particle blocking element according to clause C1, wherein said absorbing layer has a thickness sufficient to prevent backscattering of said charged particles from a portion of said substrate located below said absorbing layer and thin enough for electrical charge of said charged particles to be received by said electrically conductive surface.

C3. The charged particle blocking element according to clause C1 or C2, wherein said absorbing layer has a thickness between 100 nm to 500 nm.

C4. The charged particle blocking element according to clause C3, wherein said absorbing layer has a thickness between 150 and 250 nm.

C5. The charged particle blocking element according to any one of the preceding clauses, wherein the absorbing layer is a Boron layer, a Boron Nitride layer or a Silicon Carbide layer.

C6. The charged particle blocking element according to any one of the preceding clauses, wherein at least a part of the substrate is electrically conductive.

C7. The charged particle blocking element according to clause C6, wherein the substrate comprises a connecting part for connecting the at least a part of the substrate which is electrically conductive to a voltage supply or to ground potential.

C8. The charged particle blocking element according to any one of the preceding clauses, wherein the substrate is provided with an electrically conductive layer, wherein the electrically conductive layer is at least partially arranged in between the substrate and the absorbing layer.

C9. The charged particle blocking element according to clause C8, wherein the electrically conductive layer comprises Molybdenum (Mo) or Chromium (Cr).

C10. The charged particle blocking element according to clause C8 or C9, comprising an electrically conductive connecting part which is connected to the electrically conductive layer.

C11. The charged particle blocking element according to any one of the preceding clauses, wherein the substrate comprises a Silicon (Si) wafer.

C12. The charged particle blocking element according to any one of the preceding clauses, wherein said substrate is provided with at least one aperture allowing passage of charged particles.

C13. The charged particle blocking element according to clause C12, wherein the substrate is provided with a plurality of said apertures, wherein said apertures are arranged to form one or more aperture arrays, each of said one or more aperture arrays being arranged in a corresponding array area of said substrate.

C14. The charged particle blocking element according to clause C13, wherein said absorbing layer at least partly encloses said array areas.

C15. The charged particle blocking element according to clause C13 or C14, wherein each array area is at least partly enclosed by said absorbing layer.

C16. The charged particle blocking element according to any one of clauses C13 to C15, wherein said absorbing layer is further arranged at least partly within each array area.

C17. The charged particle blocking element according to any one of the clauses C12 to C16, wherein the absorbing layer is arranged spaced apart from the at least one aperture.

C18. The charged particle blocking element according to any one of the preceding clauses, wherein the charged particle blocking element comprises cooling conduits for cooling at least the substrate, preferably wherein the cooling conduits are arranged in thermal contact with the absorbing layer and/or the substrate.

C19. The charged particle blocking element according to clause C18, wherein the substrate is provided with a further electrically and/or heat conductive layer, wherein the further electrically and/or heat conductive layer is arranged in contact with the absorbing layer and with the cooling conduits.

C20. Current limiting element for use in a charged particle exposure apparatus, said current limiting element comprising a substrate substantially not allowing transmission of charged particles, said substrate being provided with one or more apertures extending through said substrate from a first surface to a second surface of said substrate, said one or more apertures allowing passage of charged particles,
wherein at least a portion of said first surface is provided with an absorbing layer comprising Boron (B), Carbon (C) or Beryllium (Be),
wherein said absorbing layer is provided on an electrically conductive surface.

C21. Current limiting element according to clause C20, wherein said absorbing layer at least partially encloses an area of said first surface in which said one or more apertures are arranged.

C22. The current limiting element according to clause C20 or C21, wherein the absorbing layer is arranged spaced apart from the one or more aperture.

C23. The current limiting element according to any one of clauses C20 to C22, wherein said absorbing layer has a thickness sufficient to prevent backscattering of said charged particles from a portion of said substrate located below said absorbing layer and thin enough for electrical charge of said charged particles to be received by said electrically conductive surface.

C24. The current limiting element according to any one of clauses C20 to C23, wherein said absorbing layer has a thickness of 100 nm to 500 nm.

C25. The current limiting element according to clause C24, wherein said absorbing layer has a thickness of 150 nm to 250 nm.

C26. The current limiting element according to any one of the preceding clauses, wherein the absorbing layer is a Boron layer, a Boron Nitride layer or a Silicon Carbide layer.

C27. The current limiting element according to any one of the clauses C20-C26, wherein at least a part of the substrate is electrically conductive.

C28. The current limiting element according to any one of clauses C20 to C27, wherein the substrate is provided with an electrically conductive layer, wherein the electrically conductive layer is at least partially arranged in between the substrate and the absorbing layer.

C29. The current limiting element according to clause C28, wherein the electrically conductive layer comprises Molybdenum (Mo) or Chromium (Cr).

C30. The current limiting element according to any one of clauses C27 to C29, comprising an electrically conductive connecting part for connecting the electrically conductive substrate or the electrically conductive layer to a voltage supply or to ground potential.

C31. The current limiting element according to any one of clauses C20 to C30, wherein the substrate comprises a Silicon (Si) wafer.

C32. The current limiting element according to any one of clauses C20 to C31, further comprising cooling conduits for cooling at least the substrate, preferably wherein the cooling conduits are arranged in thermal contact with the absorbing layer and/or the substrate.

C33. The current limiting element according to clause C32, wherein the substrate is provided with a further electrically conductive and/or heat conductive layer, wherein the further electrically conductive and/or heat conductive layer arranged in contact with the absorbing layer and with the cooling conduits.

C34. A shutter element for blocking a charged particle beam, said shutter element comprising a substrate, at least a portion of which is provided with an absorbing layer comprising Boron (B), Carbon (C) or Beryllium (Be), wherein said absorbing layer is provided on an electrically conductive surface on said substrate.

C35. The shutter element according to clause C34, wherein said absorbing layer has a thickness sufficient to prevent backscattering of said charged particles from said electrically conductive surface located below said absorbing layer and thin enough for electrical charge of said charged particles to be received by said electrically conductive surface.

C36. The shutter element according to clause C34 or C35, wherein said absorbing layer has a thickness between 100 nm to 500 nm.

C37. The shutter element according to clause C36, wherein said absorbing layer has a thickness between 150 and 250 nm.

C38. The shutter element according to any one of clauses C34 to C37, wherein the absorbing layer is a Boron layer, a Boron Nitride layer or a Silicon Carbide layer.

C39. The shutter element according to any one of clauses C34 to C38, wherein at least a part of the substrate is electrically conductive.

C40. The shutter element according to any one of clauses C34 to C39, wherein the substrate is provided with an electrically conductive layer, wherein the electrically conductive layer is at least partially arranged in between the substrate and the absorbing layer.

C41. The charged particle blocking element according to clause C40, wherein the electrically conductive layer comprises Molybdenum (Mo) or Chromium (Cr).

C42. The charged particle blocking element according to any one of clauses C39 to C41, comprising an electrically conductive connecting part which is connected to the part of the substrate which is electrically conductive or to the electrically conductive layer.

C43. An exposure apparatus for projecting a charged particle beam onto a target, said exposure apparatus comprising a charged particle optical arrangement for forming a charged particle beam and projecting at least a part of the charged particle beam onto the target, the charged particle optical arrangement comprising:
 a charged particle source for generating the charged particle beam, and
 a charged particle blocking element according to any one of the claims 1 to 19, which charged particle blocking element enables blocking at least a part of the charged particle beam from the charged particle source, a current limiting element according to any one of claims 20 to 33 arranged to limit a charged particle current of said charged particle beam, and/or a shutter element according to any one of claims 34 to 42 for temporarily shutting off at least a part of said charged particle beam.

C44. The exposure apparatus according to clause C43, wherein the absorbing layer of the charged particle blocking element, the current limiting element, and/or the shutter element is arranged at a surface of the substrate facing the charged particle source or facing towards a source of backscattered charged particles and/or secondary electrons.

C45. The exposure apparatus according to clause C44, wherein the shutter element is arranged as a shutter for said charged particle source.

C46. The exposure apparatus according to any one of clauses C43 to C45 comprising the current limiting element according to any one of clauses C20 to C33, wherein the current limiting element comprises an array of apertures arranged for splitting the charged particle beam into multiple charged particle beams.

C47. The exposure apparatus according to any one of the clauses C43 to C46, further comprising a modulation deflector for deflecting the charged particle beam onto the charged particle blocking element, wherein the modulation deflector and the charged particle blocking element are arranged to allow the charged particle beam to pass the aperture of the charged particle blocking element when the charged particle beam is not deflected by the deflector, and to at least partially block the charged particle beam by the charged particle blocking element when the charged particle beam is deflected by the deflector, or vice versa.

C48. A charged particle lithography system comprising an exposure apparatus according to any one of the clauses C43 to C47.

C49. A charged particle inspection system or charged particle microscope comprising an exposure apparatus according any to one of the clauses C43 to C48.

C50. A method for projecting a charged particle beam onto a target using an exposure apparatus according to any one of the clauses C43 to C49, wherein the method comprises the step of blocking at least a part of the charged particle beam from the charged particle source, wherein at least a part of the charged particle beam that is blocked falls onto the absorbing layer of the charged particle blocking element or the current limiting element.

C51. Method of manufacturing a semiconductor device by means of an exposure apparatus according to any one of the clauses C43 to C49, the method comprising the steps of:
placing a wafer downstream of said charged particle optical arrangement;
processing said wafer including projecting an image or a pattern on said wafer by means of a charged particle beam generated, shaped and/or modulated by said charged particle optical arrangement; and
performing subsequent steps in order to generate a semiconductor device by means of said processed wafer.

C52. Method for inspecting a target by means of an exposure apparatus according to any one of the clauses C43 to C49, the method comprising the steps of:
positioning said target downstream said charged particle optical arrangement;
directing a charged particle beam generated and shaped by said charged particle optical arrangement towards said target;
detecting charged particles transmitted, emitted and/or reflected by said target upon incidence of the charged particle beam on the target; and
performing subsequent steps in order to inspect said target by means of data gathered during the step of detecting charged particles.

The invention claimed is:

1. An exposure apparatus for projecting a charged particle beam onto a target, the exposure apparatus comprising a charged particle optical arrangement for forming a charged particle beam and projecting at least a part of the charged particle beam onto the target, the charged particle optical arrangement comprising:
a charged particle source for generating the charged particle beam, and
a plurality of charged particle blocking elements configured to block at least a part of the charged particle beam from the charged particle source,
wherein the charged particle blocking elements comprise a substrate, at least one of the substrates comprising at least one aperture allowing passage of at least a part of the charged particle beam, and at least one of the charged blocking elements comprising a plurality of apertures configured to form a plurality of beams from the charged particle beam,
wherein a portion of a surface of at least one of the substrates comprises an absorbing layer of a material comprising Carbon, and/or Beryllium (Be) configured to absorb at least part of charged particles impinging the surface,
wherein the absorbing layer is electrically conductive and configured to remove absorbed electrical charges.

2. The exposure apparatus according to claim 1, wherein the absorbing layer is arranged spaced apart from the at least one aperture.

3. The exposure apparatus according to claim 1, wherein the absorbing layer has a thickness sufficient to prevent backscattering of the charged particles from a portion of the substrate located below the absorbing layer.

4. The exposure apparatus according to claim 1, wherein the absorbing layer is a Silicon Carbide.

5. The exposure apparatus according to claim 1, wherein at least a part of the substrate is electrically conductive.

6. The exposure apparatus according to claim 5, wherein the substrate comprises a connecting part for connecting the at least a part of the substrate which is electrically conductive to a voltage supply or to ground potential.

7. The exposure apparatus according to claim 5, wherein the substrate is provided with an electrically conductive layer, wherein the electrically conductive layer is at least partially arranged in between the substrate and the absorbing layer.

8. The exposure apparatus according to claim 7, wherein the electrically conductive layer comprises Molybdenum (Mo) or Chromium (Cr).

9. The exposure apparatus according to claim 7, further comprising an electrically conductive connecting part that is connected to the electrically conductive layer.

10. The exposure apparatus according to claim 1, wherein the plurality of apertures are arranged to form one or more aperture arrays, each aperture array arranged in a corresponding array area of the substrate.

11. The exposure apparatus according to claim 10, wherein
the absorbing layer at least partly encloses the or each array area;
the or each array area is at least partly enclosed by the absorbing layer; and/or
the absorbing layer is further arranged at least partly within the or each array area.

12. The exposure apparatus according to claim 1, wherein the plurality of the charged particle blocking elements are comprised in a condenser lens array configured to focus the charged particle beams.

13. The exposure apparatus according to claim 1, wherein the plurality of the charged particle blocking elements are comprised in a collimator lens configured to focus the charged particle beam, to collimate the charged particle beam, or both to focus and to collimate the charged particle beam.

14. The exposure apparatus according to claim 1, wherein the charged particle blocking element comprises cooling conduits for cooling at least the substrate.

15. The exposure apparatus according to claim 1, wherein the charged particle blocking element is a current limiting element arranged to limit a charged particle current of the charged particle beam.

16. The exposure apparatus according to claim 15, wherein the absorbing layer at least partially encloses an area of a surface of the substrate in which the one or more apertures are arranged and preferably wherein the one or more apertures has a diameter smaller than a diameter of the charged particle beam at the current limiting element.

17. The exposure apparatus according to claim 16, wherein the absorbing layer of the charged particle blocking element is arranged at the surface of the substrate facing the charged particle source or facing towards a source of backscattered charged particles and/or secondary electrons.

18. The exposure apparatus according to claim 1, further comprising a modulation deflector for deflecting the charged particle beam onto the charged particle blocking element, wherein the modulation deflector and the charged particle blocking element are arranged to allow the charged particle beam to pass the aperture of the charged particle blocking element when the charged particle beans is not deflected by the deflector, and to at least partially block the charged particle beam by the charged particle blocking element when the charged particle beam is deflected by the deflector, or vice versa.

19. An exposure apparatus for projecting a charged particle beam onto a target, the exposure apparatus comprising a charged particle optical arrangement for forming a charged particle beam and projecting at least a part of the charged particle beam onto the target, the charged particle optical arrangement comprising:

a charged particle source for generating the charged particle beam, and
  a plurality of charged particle blocking elements configured to block at least a part of the charged particle beam from the charged particle source; the charged particle blocking elements comprising a substrate, at least one of the substrates comprising a plurality of apertures configured to allow passage of at least a part of the charged particle beam in a plurality of beams, at least one of the charged blocking elements being a beam splitter configured to form the plurality of beams from the charged particle beam,
  wherein the substrate of the beam splitter has at least a portion with an absorbing layer comprising Carbon (C), Boron (B), and/or Beryllium (Be), the absorbing layer provided on an electrically conductive surface on the substrate of the beam splitter, and the electrically conductive surface configured to remove absorbed electrical charges from the absorbing layer.

20. A charged particle inspection system or charged particle microscope for projecting a charged particle beam onto a target, the charged particle inspection system or charged particle microscope comprising an exposure apparatus comprising a charged particle optical arrangement for forming a charged particle beam and projecting at least a part of the charged particle beam onto a target; and a stage configured for arrangement of the target thereon, the charged particle optical arrangement comprising:

a charged particle source for generating the charged particle beam, and
  a plurality of charged particle blocking elements configured to block at least a part of the charged particle beam from the charged particle source, the charged particle blocking elements comprising a substrate, the substrates comprising at least one aperture allowing passage of at least a part of the charged particle beam,
  wherein at least one of the charged blocking elements comprises an absorbing layer of a material comprising Carbon, Boron (B), and/or Beryllium (Be) on the corresponding substrate at least part of the portion of the surface of the corresponding substrate comprises an electrically conductive material configured to remove absorbed electrical charges from the absorbing layer.

* * * * *